United States Patent [19]

Minami et al.

[11] Patent Number: 5,055,904
[45] Date of Patent: Oct. 8, 1991

[54] SEMICONDUCTOR DEVICE

[75] Inventors: Masataka Minami; Kazushige Sato, both of Hitachi; Atsuo Watanabe, Hitachiota; Shoji Shukuri, Koganei; Takashi Nishida, Tokyo; Takahiro Nagano, Hitachi, all of Japan

[73] Assignee: Hitachi, Ltd., Tokyo, Japan

[21] Appl. No.: 495,762

[22] Filed: Mar. 19, 1990

[30] Foreign Application Priority Data

Mar. 20, 1989 [JP] Japan ................................. 1-67985

[51] Int. Cl.$^5$ ...................... H01L 27/02; H01L 29/10
[52] U.S. Cl. ................................... 357/43; 357/23.4; 357/41; 357/42
[58] Field of Search .................... 357/23.4, 41, 42, 43

[56] References Cited

FOREIGN PATENT DOCUMENTS

| 0281711 | 8/1988 | European Pat. Off. ........... 357/23.4 |
| 0254653 | 12/1985 | Japan ................................. 355/23.4 |
| 0174354 | 7/1988 | Japan ................................. 357/23.4 |
| 0193558 | 8/1988 | Japan . |

OTHER PUBLICATIONS

"Submicron Bipolar-CMOS Technology Using 16 GHz Double Poly-Si Bipolar Devices", Yamaguchi et al., 1988, IEDM, pp. 748-751.

*Primary Examiner*—Rolf Hille
*Assistant Examiner*—Wael Fahmy
*Attorney, Agent, or Firm*—Antonelli, Terry, Stout & Kraus

[57] ABSTRACT

A semicondcutor device and a manufacturing method thereof are disclosed in which higher integration can be achieved without increasing the total manufacturing steps. The semiconductor device includes at least two MOS transistors having the same channel types, the gate electrodes of which are constructed of polycrystal silicon layers which contain an impurity, and a bipolar transistor, the base electrode of which is constructed of a polycrystal silicon layer which contains and impurity. In particular, the respective gate electrodes of the two MOS transistors contain impurities of different conductivity types from one another.

7 Claims, 10 Drawing Sheets

SEMICONDUCTOR DEVICE

BACKGROUND OF THE INVENTION

The present invention generally relates to a semiconductor device and a manufacturing method thereof, and more specifically to a semiconductor device and also a method for manufacturing such a semiconductor device that a bipolar transistor and MOS transistors are assembled on the same substrate.

In the conventional semiconductor devices as described in the preamble, both higher velocities and higher integration of the overall semiconductor devices have been developed. That is to say, in conjunction with the fine treatment of the MOS transistors, the bipolar transistor is similarly manufactured with higher performances.

In case that a MOS transistor is fabricated, a gate electrode thereof is formed, and then is used as a portion of a mask for forming a drain layer and a source layer, taking account of such a fact that this gate electrode is not removed during the subsequent manufacturing step. A so-called "self-alignment" method has been utilized. Since there is no problem to cause the mask shifts with employment of such a self-alignment method, the distance between the drain layer and source layer can be considerably reduced.

On the other hand, even in a bipolar transistor, a method similar to the above-described self-alignment method has been utilized. In other words, a base electrode constructed of a polycrystal silicon layer containing an impurity (for instance, a p type impurity) is formed which surrounds a region where an emitter is formed, the above-described impurity is diffused from a semiconductor plane which is exposed at a center of this base electrode, and simultaneously an impurity contained within the base electrode is also diffused in the thermal (heat) treatment so as to form a base layer. Then, an emitter electrode made of a polycrystal silicon layer containing an impurity (for instance, an n type impurity) is formed in connection with the above-described semiconductor plane which is exposed from the base electrode, an impurity contained in the emitter electrode is diffused by a thermal treatment so as to fabricate an emitter layer within the base layer (refer to pages 748 to 751, International Electron Device Meeting technical digest).

Then, very recently, when the above-described bipolar transistor is formed together with the MOS transistors, these elements have been manufactured by the self-alignment method, and the gate electrodes thereof have been formed by the polysilicon layers into which an impurity (i.e., an impurity having a conductivity type different from a semiconductor layer in which a channel layer is formed). This is because when the polycrystal silicon layer is used as the gate electrode, there are particular advantages that an oxide film is formed on a side wall portion thereof so as to achieve the insulation, such a drawback that metal particles are diffused to a side of a semiconductor substrate can be prevented, and also an easy treatment and higher reliabilities can be realized.

However, in the thus formed semiconductor devices, in case that each of the MOS transistors is of the same channel types, for instance, n channel types, all of the impurities contained in the polycrystal silicon for constituting the gate electrode thereof are of the same n types. As an example where the conductivities of the gate electrodes are the same, there are described in JP-A-60-254653 and JP-A-63-193558 (EP-A-281711). When a bipolar transistor is of an n p n type, it is different from a p type impurity contained in polycrystal silicon for constituting a base electrode thereof. This implies that there is an advantage such that the n-type polycrystal silicon layer functioning as the gate electrodes of each of the MOS transistors can be fabricated in the same manufacturing step. However, since each of the n type polycrystal silicons must be separated from each other at a distance longer than a predetermined distance in order to establish an electrical isolation, there is a limitation in a minimum distance for this separating distance.

SUMMARY OF THE INVENTION

Therefore, an object of the present invention is to provide a semiconductor device and a method for manufacturing such a semiconductor device that higher integration can be achieved without increasing a manufacturing step.

To achieve such an object, in a semiconductor device according to the present invention, including at least, more than two MOS transistors having the same channel types, the gate electrodes of which are constructed of polycrystal silicon layers into which an impurity has been contained, and a bipolar transistor the base electrode of which is constructed of a polycrystal silicon layer into which an impurity is contained, there are provided the steps of: forming the gate electrode of one MOS transistor by a first conductivity type polycrystal silicon layer; covering a side surface of said first conductivity type polycrystal silicon layer with an insulating film; and, forming the gate electrode of the other MOS transistor by a conductivity different from said first conductivity, type polycrystal silicon layer; wherein said base electrode of the bipolar transistor is simultaneously formed with one of said step for forming said first conductivity type polycrystal silicon layer and of said step for forming said conductivity type polycrystal silicon layer different from said first conductivity type polycrystal silicon layer.

In the above-described construction, while forming with the conductivity type polycrystal silicon layer different from the first conductivity type polycrystal silicon layer, there is no description on a step for covering a side surface of this polycrystal silicon layer with an insulating film. However, this side surface may be covered with the insulating film similar to the above-described first conductivity type polycrystal silicon layer.

Also, an emitter electrode of the above-described bipolar transistor is also constructed of a polycrystal silicon layer containing an impurity, and this polycrystal silicon layer is simultaneously formed with the step other than the step for simultaneously forming the base electrode of the bipolar transistor, among said step for forming the first conductivity type polycrystal silicon layer and also said step for forming the conductivity type polycrystal silicon layer different from said first conductivity type polycrystal silicon layer.

Further, in the above-described respective manufacturing methods, with respect to the MOS transistor among the respective MOS transistors, in which the polycrystal silicon layer containing the impurity different from the channel type is formed, there is further provided a step of forming the same type semiconductor layer for connecting a drain layer thereof and a source layer thereof in a channel region between said drain layer and source layer.

Furthermore, although the same channel type MOS transistors have been assembled in the above-described semiconductor device, the present invention is not limited thereto, but may be applied to such a semiconductor device that different channel types of more than two MOS transistors are assembled.

Although the above descriptions have been made in the semiconductor device in which the bipolar transistor has been assembled on the same substrate, the present invention may be applied to such a semiconductor device in which only a plurality of MOS transistors are assembled. That is to say, in a semiconductor device including at least, more than two MOS transistors having the same channel types, the gate electrodes of which are constructed of polycrystal silicon layers into which an impurity has been contained, there are provided the steps of: forming the gate electrode of one MOS transistor by a first conductivity type polycrystal silicon layer; covering a side surface of said first conductivity type polycrystal silicon layer with an insulating film; and, forming the gate electrode of the other MOS transistor by a conductivity type polycrystal silicon layer different from said first conductivity type polycrystal silicon layer.

BRIEF DESCRIPTION OF THE DRAWINGS

The present invention will be more apparent from the following detailed description, when taken in conjunction with the accompanying drawings, in which.

DESCRIPTION OF THE PREFERRED EMBODIMENTS

Figure 1:
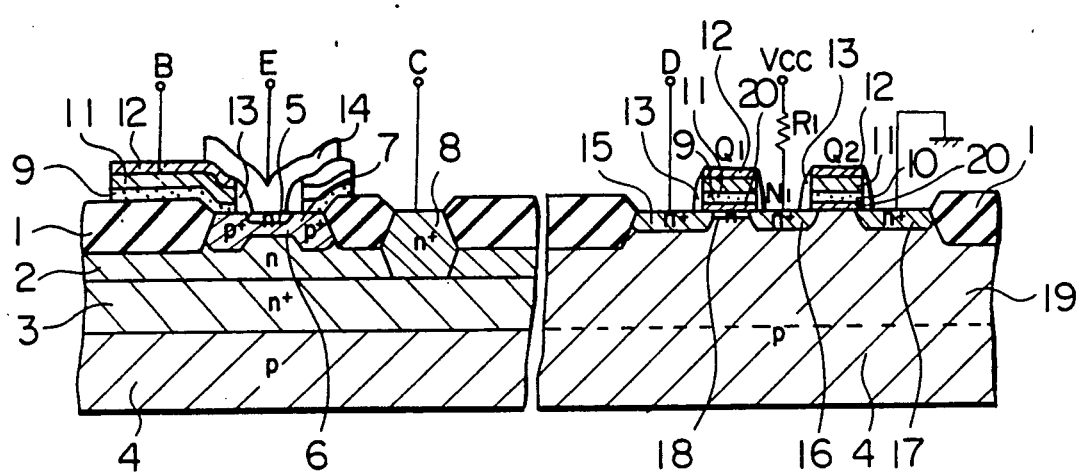
FIG. 1 is a sectional view of a semiconductor device according to one preferred embodiment of the present invention.

As previously stated, in a semiconductor device comprising more than two same channel type MOS transistors in which gate electrodes are constructed of polycrystal silicon layers containing an impurity; and a bipolar transistor in which a base electrode is formed by a polycrystal silicon layer containing an impurity, each of the polycrystal silicon layers can be arranged under adjoining conditions when the impurities contained in the polycrystal silicon layers for constructing each of the gate electrodes are different from each other, and these respective polycrystal silicon layers are fabricated in separate manufacturing steps with such a condition that a side of at least one polycrystal is isolated. Since the side of one polycrystal silicon layer is isolated from that of the other polycrystal silicon layer, both sides may be in contact with each other under the extreme condition. As a consequence, the MOS transistors can be closely arranged with each other, whereby the integration of the semiconductor device can be increased.

In this case, although there is an increase in the manufacturing steps when the above-described respective polycrystal silicon layers are manufactured in the separate manufacturing steps, since the polycrystal silicon layer in which the base electrode of the bipolar transistor contains the same impurity is fabricated by one manufacturing step, and this polycrystal silicon layer is simultaneously manufactured with the other polycrystal silicon layer, the overall manufacturing stages of the entire semiconductor device are not increased.

In this case, since the side of the base electrode of the other MOS transistor is similarly isolated from the side of the base electrode of one MOS transistor, each of the MOS transistors can be closely arranged between the wiring layer extended from this gate electrode and another wiring layer constructed of the polycrystal silicon.

In case that the emitter electrode of the above-described bipolar transistor is manufactured by the polycrystal silicon layer containing the impurity, if this polycrystal silicon layer is fabricated in the same manufacturing stages as in one gate electrode of the respective MOS transistors, the total number of the manufacturing stages may be furthermore decreased.

In case of the same channel type MOS transistors, when the impurities contained in the polycrystal silicon constructing the gate electrodes thereof are different from each other, a difference may be produced in the threshold voltage (Vth) of the respective MOS transistors. However, in case that the impurities contained in the polycrystal silicon are wished to be the same with each other, in a MOS transistor in which a polycrystal silicon layer containing an impurity different from that of the channel type, if a same type semiconductor layer for connecting a drain layer and a source layer is formed in a channel region between this drain layer and source layer, the MOS transistors having the same impurities may be achieved.

Furthermore, although the same channel type MOS transistors have been assembled in the above-described semiconductor device, the present invention is not limited thereto, but may be applied to such a semiconductor device that different channel types of more than two MOS transistors are assembled, and more specifically, the respective MOS transistors may be closely arranged with each other between the wiring layers extended from each of the gate electrodes thereof.

Referring now to drawings, both a semiconductor device and a manufacturing method thereof according to one preferred embodiment of the present invention will be described.

FIG. 1 is a sectional view of a semiconductor device according to one preferred embodiment of the present invention.

In FIG. 1, there are a region in which an npn type bipolar transistor is formed on the same semiconductor substrate plane, and also a region in which an N channel type MOS (Metal Oxide Semiconductor) transistor constructed of a memory cell is formed.

In the region where the above-described bipolar transistor has been manufactured, an n+ type semiconductor layer 3 and an n type semiconductor layer 2 are successively formed on a p type semiconductor substrate 4. A base layer constructed of a p type diffusion layer 6 and a p+ type diffusion layer 7 is formed on a surface of this n type semiconductor layer 2. Furthermore, an emitter layer constructed of an n type diffusion layer 5 is formed on a portion of the surface of this base layer. A thickness of the above-described base layer immediately under the emitter layer is thin, and this base layer is constructed of an intrinsic base region the concentration of which is low, and an external region positioned around this intrinsic base region, the thickness of which is thick and the concentration of which is high.

Both the surface of the above-described base layer and the surface of the emitter layer formed on a surface portion of this base layer are exposed, and a field oxide film 1 is fabricated on the surface of the n type semiconductor layer 2 by means of so-called "a local oxidation of silicon". There is a portion where the above-described field oxide film 1 has not been fabricated on the region adjacent to the base layer of this field oxide film 1. On this portion, an n+ type diffusion layer 8 which has reached the n+type semiconductor layer 3 is manufactured. This n+ diffusion layer 8 is connected to the n type semiconductor layer 2 constructed as a collector layer, which becomes a collector 31C layer.

Then, a lead electrode is formed on a surface of the p+ type diffusion layer 7 functioning as a base layer, which extends over the oxide film 1. This lead electrode is manufactured by a multi structure. A p type polycrystal silicon layer 9, a tungsten polyside layer 11, and an insulation layer 12 are successively stacked from the p+ type diffusion layer 7. A side surface of the lead electrode at the side of the p+ type diffusion layer 7 is formed under such a condition that a side spacer 13 causes the n+ type diffusion layer 5 to be exposed. On the surface of the n+ type diffusion layer 5 exposed from the side spacer 13, for instance, a polycrystal silicon layer constituting an emitter electrode is formed. This polycrystal silicon layer contains an n+ type impurity.

In the region in which the above-described MOS transistor has been fabricated, a p type semiconductor layer 19 is formed on the p type semiconductor substrate 4. Two MOS transistors are formed on a surface of the p type semiconductor layer 19. That is to say, n+ type diffusion layers 15, 16 and 17 are formed on the surface of the p type semiconductor layer, whereas a gate oxide film 20 is fabricated on the plane of the p type semiconductor layer 19 between the n+ type diffusion layers 15 and 16, and also between the n+ type diffusion layers 16 and 17.

Then, on the surfaces of the respective gate oxide film 20, gate electrodes each made of multi structures are formed. On the gate oxide film 20 between the n− type diffusion layers 15 and 16 among them, a p type polycrystal silicon layer 9, a tungsten polyside layer 11 employed for improving a lower resistance value, and an insulation film 12 are successively stacked from the side of this gate oxide film 20. On the gate oxide film 20 between the n+ type semiconductor layers 16 and 17, an n type polycrystal silicon layer 10, the tungsten polyside layer 11 and insulation film 12 are stacked from the side of the gate oxide film 20. Then, a side spacer 13 made of an insulating material is formed on a side wall of each of these gate electrodes.

It should be noted that two MOS transistors constructed in such an arrangement have a structure in which the n+ type diffusion layers ar commonly employed so as to improve an integration density. On a so-called "channel forming region" of the surface of the p type semiconductor layer 19 under the gate oxide film 20 between the n+ type diffusion layers 15 and 16, an n type semiconductor layer 18 having a relatively thin film thickness is fabricated. This is because in one MOS film transistor positioned at a side where this n type semiconductor layer 18 has been fabricated, a conducting layer adjacent to the gate oxide film 20 among the gate electrode thereof is manufactured by the p type polycrystal silicon layer 9, whereas another conducting layer corresponding to that of the other MOS transistor is manufactured by the n type polycrystal silicon layer 10, so that the difference in the respective threshold voltages (Vth) can be compensated.

On the surface of the p type semiconductor layer 19 outside the region in which the above-arranged MOS transistors are formed, the field oxide film 1 fabricated by the local oxidation of silicon method has been manufactured. Normally, this oxide film 1 is simultaneously fabricated with the oxide film 1 on the region in which the above-described bipolar transistor has been formed.

The above-described two MOS transistors shown in FIG. 1 correspond to a transfer MOS transistor $Q_1$ and a driver MOS transistor $Q_2$ constituting a memory cell of a so-called "static RAM (random Access Memory) as represented in FIG. 15. This transfer MOS transistor $Q_1$ and driver MOS transistor $Q_2$ are both N channel type MOS transistors. Since both the source of the transfer MOS transistor and the drain of the driver MOS transistor are commonly connected at a memory node $N_1$, these source and drain regions are formed by the common n+ type diffusion layer 16 in FIG. 1. It should be noted that a signal from a data line D is input into the n+ type diffusion layer 15 corresponding to the drain of the transfer MOS transistor $Q_1$, and the n type diffusion layer 17 corresponding to the source of the driver MOS transistor is connected to the ground.

It should be also noted that although the bipolar transistor represented in FIG. 1 is indirectly and electrically connected to the above-described memory cell of the static RAM, this bipolar transistor is represented as a transistor constituting a separate circuit.

Referring now to FIGS. 3a through 3j, a manufacturing method of the semiconductor device shown in FIG. 1 will be described.

Figure 3A:
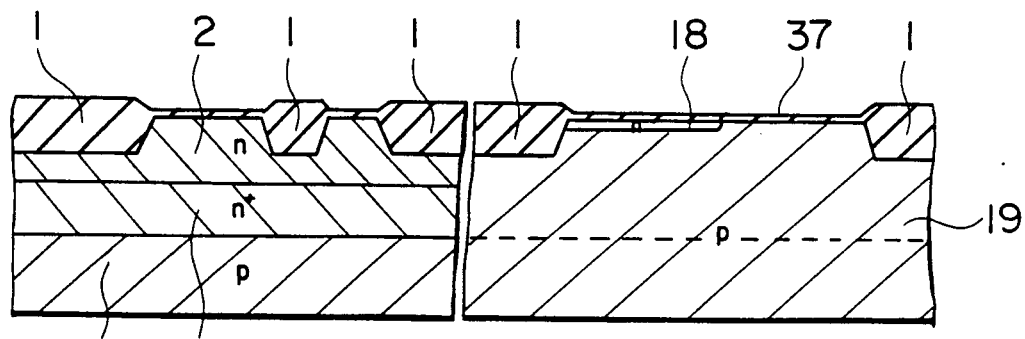
FIGS. 3a to 3j illustrate a manufacturing step of the semiconductor device according to one preferred embodiment of the present invention.

A simple explanation will be first made on a surface treatment of a semiconductor substrate prepared for a first manufacturing stage shown in FIG. 3a. First of all, an n+ type diffusion layer is selectively formed on a region of a surface of a p type semiconductor substrate, in which a bipolar transistor is fabricated. An intrinsic semiconductor layer having no impurity is formed on this surface of the n+ type diffusion layer and another surface of the p type semiconductor substrate at another region by way of, for instance, an epitaxial growth method and the like. Thereafter, from the surface of the semiconductor layer which has been fabricated by this epitaxial growth method, an n type impurity is selectively doped in a region where the above-described bipolar transistor should be fabricated, and a p type impurity is selectively doped in other regions. These doping treatments are performed until the doped materials substantially reach the respective n+ diffusion layer and p type semiconductor substrate.

As represented in FIG. 3a, in the semiconductor substrate thus formed, the n+ type semiconductor layer 3 and n type semiconductor layer 2 are successively formed on the p type semiconductor substrate 4 in the region where the bipolar transistor is formed. Also, in other regions, namely the regions where the MOS transistors are formed, the p type semiconductor layer 19 is formed on the p type semiconductor substrate 4, that is, the first-mentioned semiconductor layer 19 having the same conductivity type as that of the second-mentioned semiconductor substrate 4.

Then, on the surfaces of the n type semiconductor layer 2 and p type semiconductor layer 19 thus formed, a field oxide film 1 having a relatively thick thickness is fabricated at the region where the bipolar transistor is positioned, and at the regions other than those where the MOS transistors are fabricated by means of the well known local oxidation of silicon method. An oxide film 37 having a relatively thin thickness is formed on an n type semiconductor layer 2 and p type semiconductor layer 19 which are exposed from this field oxide film 1. This oxide film 37 corresponds to a gate oxide film of a MOS transistor. Subsequently, an n type impurity is doped via the gate oxide film 37 to the region where one of two MOS transistors is fabricated, whereby an n type semiconductor layer 18 is formed. This n type semiconductor layer 18 corresponds to a conducting layer which will be formed on a region where a channel layer of one MOS transistor is formed (FIG. 3a).

Figure 3B:
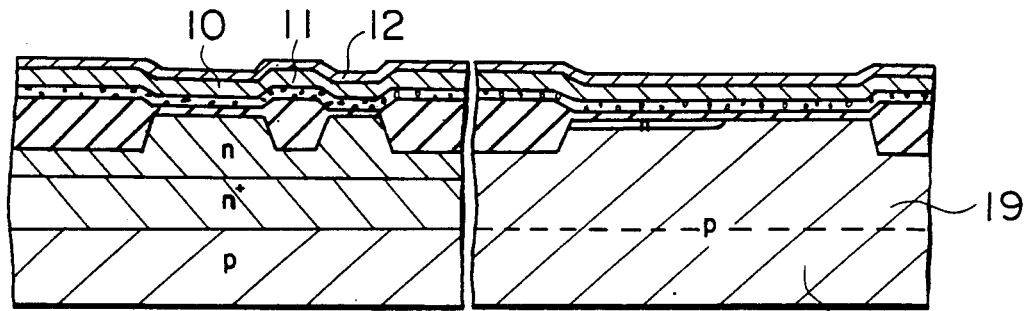

Thereafter, an a type polycrystal silicon layer 10, a tungsten polyside layer 11 having a low resistance value, and an insulation film 12 are successively formed on the overall region of the oxide film the surface of which has been treated (FIG. 3b).

Figure 3C:
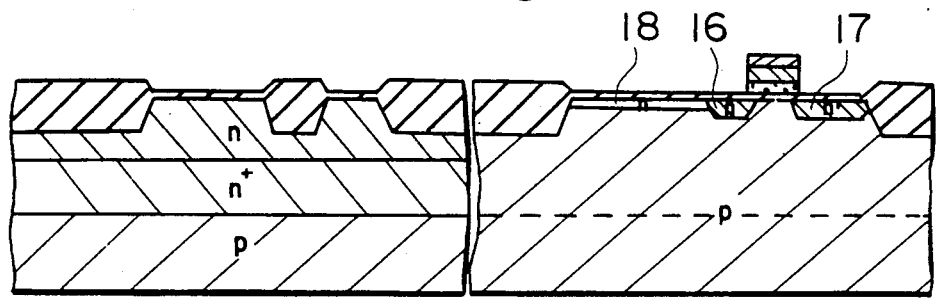

With the well known photoetching technique, only the above-described n type polycrystal silicon layer 10, tungsten polyside layer 11 and insulation film 12 which have been formed on the gate oxide film 37 of the MOS transistor having no n type semiconductor layer 18, are left and other regions are completely removed. Thus, a gate electrode is fabricated by the remaining n type polycrystal silicon layer 10, tungsten polyside layer 11 and insulation film 12. Thereafter, n type semiconductor layers 16 and 17 functioning as a drain region and a source region are formed by selectively doping an n type impurity. It should be noted in this case that the above-described gate electrode functions as a mask during the doping operation of the n type impurity, and thus the shifts caused when other masks are employed can be prevented, so that the n type semiconductor layers 16 and 17 can be fabricated with the improved integration (FIG. 3c).

Figure 3D:
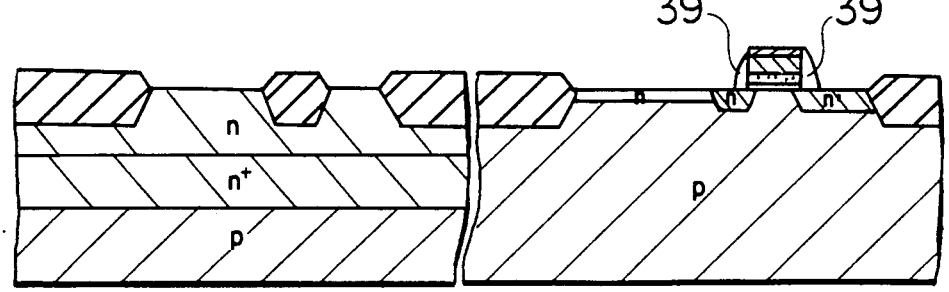

Then, an insulation film 39 is formed at an end surface of the gate electrode. This insulating film 39 is manufactured in such a manner than an oxide film is deposited on an overall area thereof by a CVD (chemical vapor deposition) method and furthermore, the deposited area is etched by an anisotropic dry etching. At this time, the above-described oxide film 37 is also removed. As a result, the semiconductor plane is exposed and only the oxide film 37 functioning as a gate oxide film remains (FIG. 3d).

Figure 3E:
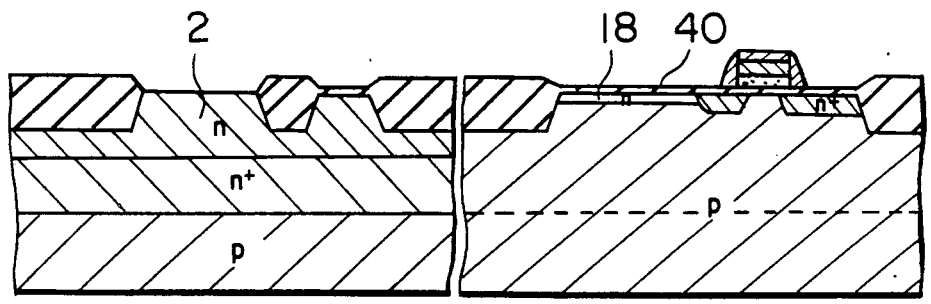

Subsequently, an oxide film 40 having a relatively thin thickness is formed on the exposed semiconductor plane by way of the thermal treatment, and thereafter, only the oxide film 40 of the region where a base layer is formed within the bipolar forming region is selectively etched by means of, for example, a wet etching. This oxide film 40 functions MOS transistor at the side where the n type semiconductor layer 18 has been formed (FIG. 3e).

Figure 3F:
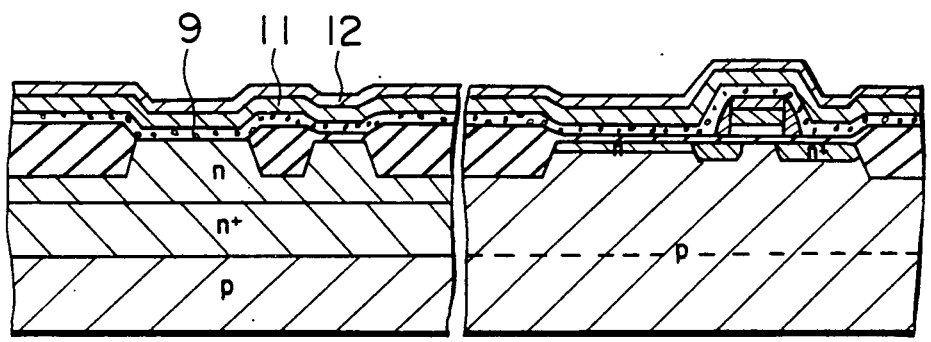

As described above, the p type polycrystal silicon layer 9, tungsten polyside layer 11, and insulation film 12 are successively formed on the entire surface where a portion of the n type semiconductor layer 2 is exposed (FIG. 3f).

Figure 3G:
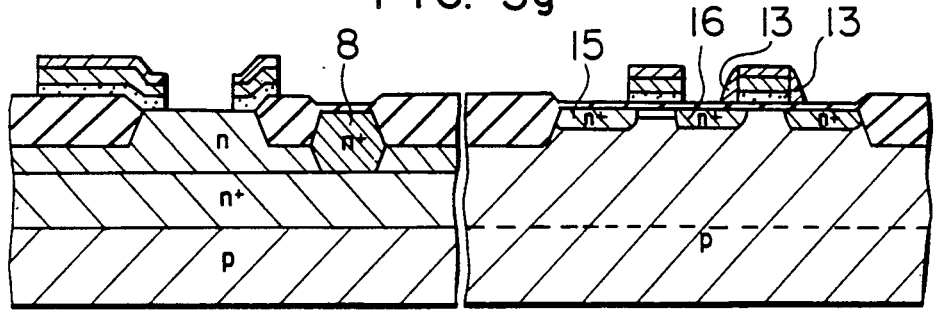

Then, while both the gate electrode of the MOS transistor among the two MOS transistors, in which the n type semiconductor layer 18 has been fabricated, and the region where the base electrode of the bipolar transistor is formed are left, the p type polycrystal silicon layer 9, tungsten polyside layer 11, and insulation film 12 formed on other regions are removed. Thereafter, an n+ type semiconductor layer 15 functioning as a drain layer is formed by selectively doping an n+ impurity while the above-described gate electrode is employed as a portion of a mask. Furthermore, an n+ type impurity is selectively doped in a region from which a collector of the bipolar transistor is derived, so that the n+ type diffusion layer 8 is fabricated in such a way that it reaches the n+ type semiconductor layer 3 (FIG. 3g).

Figure 3H:
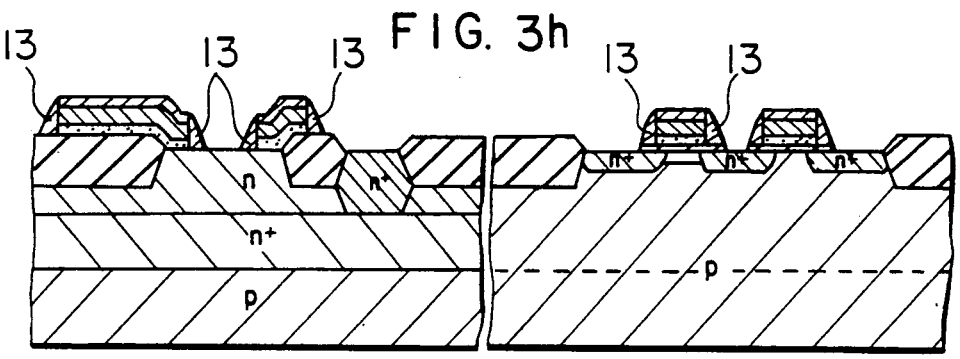

Thereafter, an insulation film 39 is formed at the side walls of the respective electrodes which have been formed in the previous manufacturing steps. This insulation film 39 is manufactured in such a manner that the oxide film is deposited by the CVD method over the entire region and furthermore, the deposited region is etched by the anisotropic dry etching. In this case, the oxide film 40 is also removed. As a result, only the oxide film 40 functioning as a gate oxide film, among the above-described oxide film 40, remains (FIG. 3h).

Figure 3I:
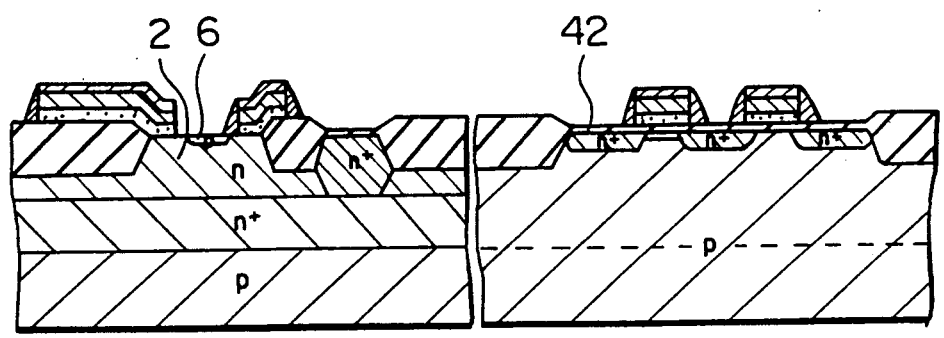

Then, an oxide film 42 is formed on the exposed semiconductor plane. In particular, the plane of the n type semiconductor layer 2 is exposed by removing the oxide film 42 surrounded by the base electrode which has been fabricated at the region where the base layer of the bipolar transistor is formed. Subsequently, a p type impurity is doped in the exposed plane of the n type semiconductor layer 2 so as to form the p type semiconductor layer 6. It should be noted that the doping operation of the p type impurity is carried out while the above-described base electrode is used as a mask, and therefore the mask shifts caused when other masks are employed can be prevented, so that the p type semiconductor layer 6 can be fabricated with the improved integration (FIG. 3i).

In addition, the p type impurity within the p type polycrystal silicon layer 9 for constituting the base electrode is diffused into the n type semiconductor layer 2 by the thermal treatment. As a result, the p type semiconductor layer 6 which has been formed in the previous manufacturing step is formed as an intrinsic base region, whereas the p+ type semiconductor layer 7 which has been similarly formed in the preceding process step is fabricated as an external base region.

Figure 3J:
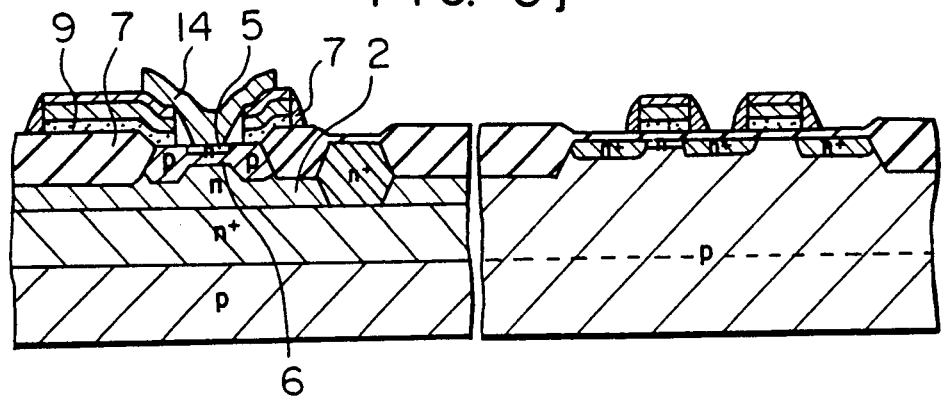

Subsequently, an n type polycrystal silicon layer 14 is formed by the photoetching method on the plane from which the p type semiconductor layer 6 is exposed, which will be used as an emitter electrode. The n type impurity within the n type polycrystal silicon layer 14 is diffused by the thermal treatment so that the n+ type semiconductor layer 5 functioning as an emitter layer is formed (FIG. 3j).

Thereafter, electrodes made of aluminum and the like are led from the source layers, drain layers of the respective MOS transistors and the collector layer of the bipolar transistor, whereby wiring layers are formed so as to complete the semiconductor device.

Figure 4:
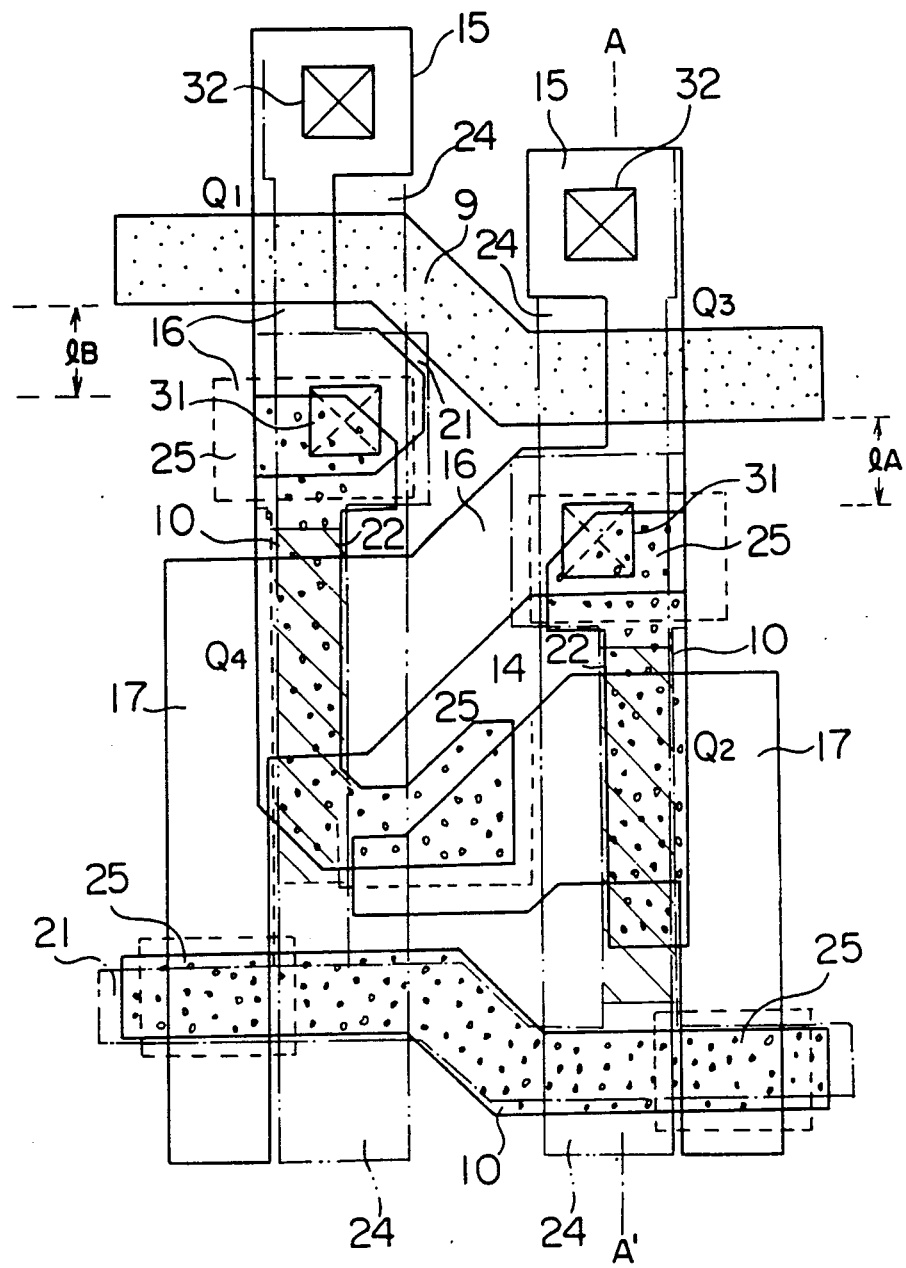
FIG. 4 is a plan view for representing a wiring layout of the semiconductor device according to one preferred embodiment of the present invention.
Figure 5:
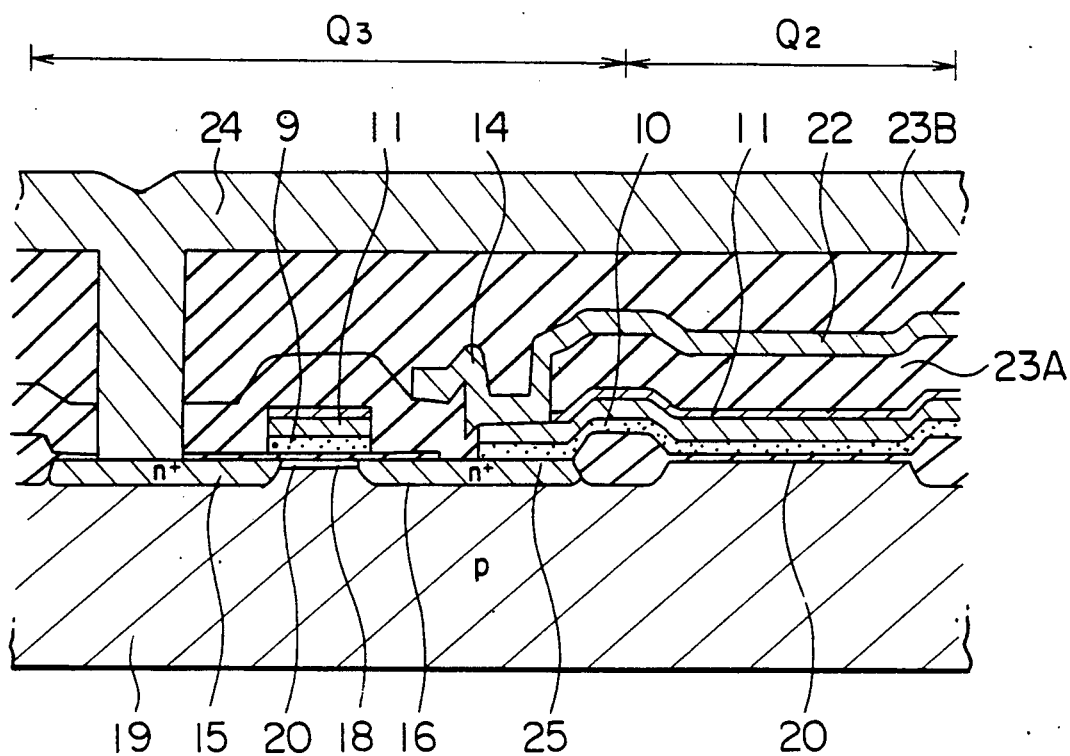
FIG. 5 is a sectional view for partially representing the semiconductor device, taken along line A—A shown in FIG. 4.

In FIG. 4, there is shown a wiring pattern according to a preferred embodiment, on the surface of the semiconductor device having the fundamental arrangement shown in FIG. 1. FIG. 5 is a sectional view of the semiconductor device, taken along the line A—A shown in FIG. 4. FIG. 5 specifically represents the sectional view of the portion where the transfer MOS transistor $Q_3$ and driver MOS transistor $Q_2$ among the MOS transistors shown in FIG. 2, and is different from another sectional view shown in FIG. 1, in which the MOS transistor $Q_2$ extends along the channel length. The wiring layer constructed of a three-layer structure is formed via insulation films 23A and 23B provided between the layers, which is more concrete than that of FIG. 1. That is to say, there is the insulation film 23A between the layers for covering the MOS transistor, and both an n type polycrystal silicon layer 14 connected through a hole made in this insulation film 23A to the gate electrode of the driver MOS transistor $Q_2$, and an i type polycrystal silicon layer 22 formed by a high resistance wiring layer and connected to this polycrystal silicon layer 14 are formed in such a manner that these silicon layers 14 and 22 ride over the insulation film 23A between the layers. This n type polycrystal silicon layer 14 is simultaneously fabricated with, for example, the n type polycrystal silicon layer 14 corresponding to the emitter electrode of the bipolar transistor. Furthermore, another insulation film 23B between the layers is formed, over which a metal wiring layer 24 connected to the n+ type semiconductor layer 15 via a hole, corresponding to the drain of the transfer MOS transistor $Q_3$ has been fabricated.

With such an arrangement, the wiring layer made of the materials corresponding to the reference numerals of FIG. 5 is represented in FIG. 14. In particular, both a distance "$l_4$" between the p type polycrystal silicon layer 9 for constructing the respective gate electrodes of the transfer MOS transistors $Q_1$ and $Q_3$, and the n type polycrystal silicon layer 10 for constructing the gate electrode of the driver MOS transistor $Q_3$, and also another distance "$l_B$" between the p type polycrystal silicon layer 9 and the n type polycrystal silicon layer 10 for constituting the gate electrode of the driver MOS transistor $Q_4$ can be considerably shortened, as compared with the conventional distances.

Figure 2:
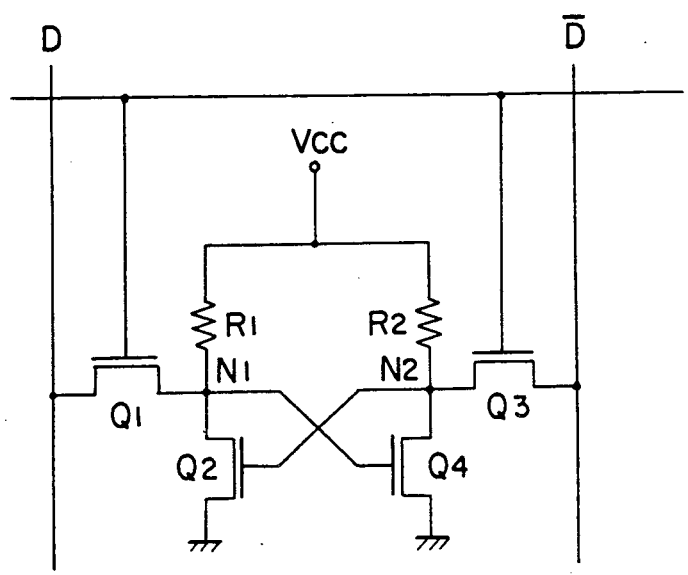
FIG. 2 is a circuit diagram of MOS transistors built in the semiconductor device shown in FIG. 1.
Figure 7:
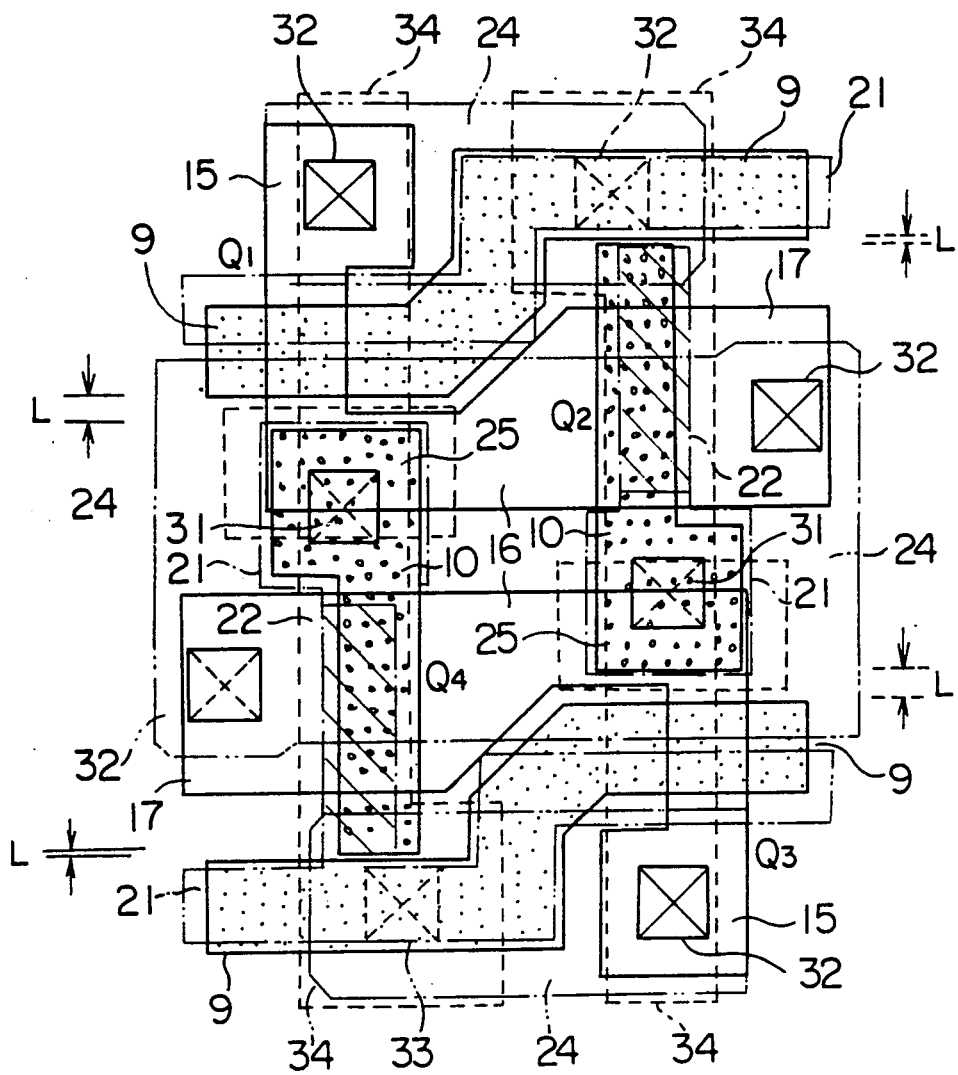
FIG. 7 is a plan view for illustrating a wiring layout according to one preferred embodiment of the semiconductor device shown in FIG. 6.

FIG. 7 is a plan view of a semiconductor device according to another preferred embodiment, in which an arrangement of MOS transistors is different from that of FIG. 2 and a different wiring pattern is formed. As apparent from FIG. 7, the transfer MOS transistors $Q_1$ and $Q_3$, and the driver MOS transistors $Q_2$ and $Q_4$ are arranged on each of diagonal lines. Also in this semiconductor device, the gate electrodes of the transfer MOS transistors $Q_1$ and $Q_3$ are formed by the p type polycrystal silicon layer 3, whereas the gate electrodes of the driver MOS transistors $Q_2$ and $Q_4$ are fabricated by the n type polycrystal silicon layer 10.

The respective n type polycrystal silicon layers 10 are commonly positioned between the p type polycrystal silicon layers 9, and distances "L" between them are considerably shorter than those of the conventional semiconductor device.

Figure 6:
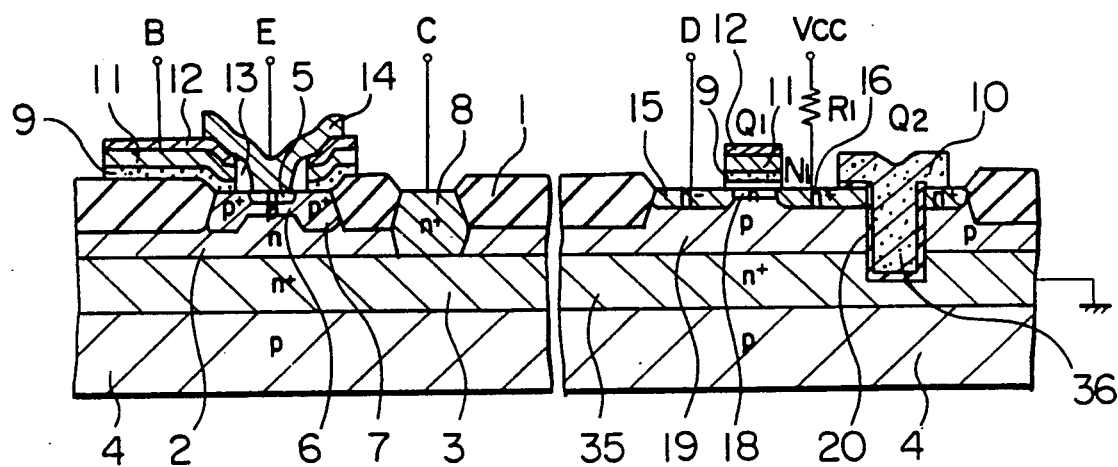
FIG. 6 is a sectional view of a semiconductor device according to another preferred embodiment of the present invention.

FIG. 6 is a schematic diagram of a semiconductor device according to another preferred embodiment of the invention. It should be noted that the same reference numerals shown in FIG. 1 will be employed for denoting those having the same materials and same functions. An arrangement different from that of FIG. 1 is a region in which MOS transistors are formed, and a driver MOS transistor is constructed as a so-called "lateral MOS transistor". As a consequence, the region where the MOS transistors are arranged is such that the n+ type semiconductor layer 4 and p type semiconductor layer 19 are sequentially formed on the n+ type semiconductor layer. A well is formed in such a manner that the n+ type semiconductor layer 16 formed on the surface of this p type semiconductor layer 19 is subdivided, a gate oxide film 20 is formed on both the bottom surface and inside surface of this well, and the gate electrode constructed of the n type polycrystal silicon layer 10 is filled with this well. The well is formed until this well reaches the n+ type semiconductor layer 4. The n+ type semiconductor layer 4 is used as a drain layer, the n+ type semiconductor layer is used as a source layer, and a channel layer is formed along the gate oxide film 20.

Figure 8:
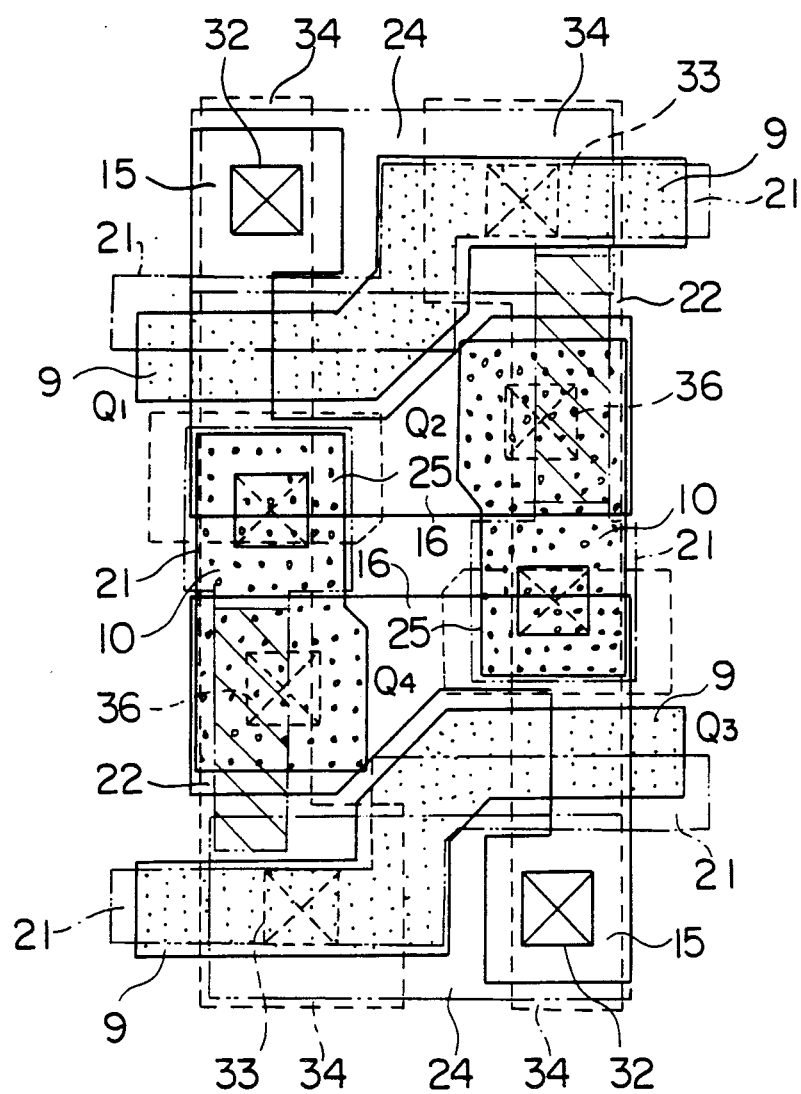
FIG. 8 is a plan view for representing another wiring layout according to another preferred embodiment of the semiconductor device.

The arrangement of the wiring layer as represented in FIG. 8 can be achieved when the lateral MOS transistors are employed as the driver MOS transistors $Q_2$ and $Q_4$, and are arranged similar to that of FIG. 7. The dimensions of the MOS transistors shown in FIG. 8 are the same as those of FIG. 7 so that the integration of the semiconductor device can be highly increased in conjunction with the property of the lateral MOS transistors with the higher integration. The similar structures are described in U.S. patent Ser. No. 143530 (JP-A-63-174354).

As previously described, according to the present invention, in a semiconductor device comprising more than two same channel type MOS transistors in which gate electrodes are constructed of polycrystal silicon layers containing an impurity; and a bipolar transistor in which a base electrode is formed by a polycrystal silicon layer containing an impurity, each of the polycrystal silicon layers can be arranged under adjoining conditions when the impurities contained in the polycrystal silicon layers for constructing each of the gate electrodes are different from each other, and these respective polycrystal silicon layers are fabricated in separate manufacturing steps with such a condition that a side of at least one polycrystal is isolated. Since the side of one polycrystal silicon layer is isolated from that of the other polycrystal silicon layer, both sides may be in contact with each other under the extreme condition. As a consequence, the MOS transistors can be closely arranged with each other, whereby the integration of the semiconductor device can be increased.

In this case, although there is an increase in the manufacturing step when the above-described respective polycrystal silicon layers are manufactured in the separate manufacturing steps, since the polycrystal silicon layer in which the base electrode of the bipolar transistor contains the same impurity is fabricated by one manufacturing step, and this polycrystal silicon layer is simultaneously manufactured with the other polycrystal silicon layer, the overall manufacturing stages of the entire semiconductor device are not increased.

In this case since the side of the base electrode of the other MOS transistor is similarly isolated from the side of the base electrode of one MOS transistor, each of the MOS transistors can be closely arranged between the wiring layer extended from this gate electrode and another wiring layer constructed of the polycrystal silicon.

In case that the emitter electrode of the above-described bipolar transistor is manufactured by the polycrystal silicon layer containing the impurity, if this polycrystal silicon layer is fabricated in the same manufacturing stages as in one gate electrode of the respective MOS transistors, the total number of the manufacturing stages may be furthermore decreased.

In case of the same channel type MOS transistors, when the impurities contained in the polycrystal silicon constructing the gate electrodes thereof are different from each other, a difference may be produced in the threshold voltage (Vth) of the respective MOS transistors. However, in case that the impurities contained in the polycrystal silicon are wished to be the same with each other, in a MOS transistor in which a polycrystal silicon layer containing an impurity different from that of the channel type, if a same type semiconductor layer for connecting a drain layer and a source layer is formed in a channel region between this drain layer and source layer, the MOS transistors having the same impurities may be achieved.

Furthermore, although the same channel type MOS transistors have been assembled in the above-described semiconductor device, the present invention is not limited thereto, but may be applied to such a semiconductor device that different channel types of more than two MOS transistors are assembled, and more specifically, the respective MOS transistors may be closely arranged with each other between the wiring layers extended from each of the gate electrodes thereof.

What is claimed is:

1. A semiconductor device comprising:
    at least two MOS transistors having channels of the same conductivity type, the gate electrodes of which are comprised of polycrystal silicon layers containing an impurity; and
    a bipolar transistor, the base electrode of which is comprised of a polycrystal silicon layer containing an impurity,
    wherein one of said MOS transistors has a gate electrode including a first conductivity type polycrystal silicon layer, wherein said gate electrode has a side surface which is covered with an insulating film, and wherein the other of said MOS transistors has a gate electrode which includes a second conductivity type polycrystal silicon layer different from said first conductivity type polycrystal silicon layer.

2. A semiconductor device as claimed in claim 1, wherein a side surface of the second conductivity type polycrystal silicon layer is covered with an insulating film.

3. A semiconductor device as claimed in claim 1, wherein said bipolar transistor has an emitter electrode formed by a polycrystal silicon layer.

4. A semiconductor device as claimed in claim 3, wherein in one of the MOS transistors among the respective MOS transistors, in which the polycrystal silicon layer contains an impurity different from the channel type, the same type semiconductor layer for connecting a drain layer thereof and a source layer thereof is formed in a channel region between said drain layer and source layer.

5. A semiconductor device as claimed in claim 1, wherein said at least two MOS transistors are part of a memory cell, and wherein said one of said MOS transistors is a driver transistor for said memory cell and said other of said MOS transistors is a transfer transistor for said memory cell.

6. A semiconductor device as claimed in claim 1, wherein said gate electrodes of said at least two MOS transistors are respectively formed in separate manufacturing steps.

7. A semiconductor device as claimed in claim 5, wherein the gate electrode for said driver transistor is formed in a separate manufacturing step from the gate electrode of said transfer transistor.

* * * * *